(12) United States Patent
Williams et al.

(10) Patent No.: US 6,838,389 B2
(45) Date of Patent: Jan. 4, 2005

(54) HIGH SELECTIVITY ETCHING OF A LEAD OVERLAY STRUCTURE

(75) Inventors: Kurt E. Williams, Seaford, NY (US); Hariharakeshara Hegde, Little Neck, NY (US)

(73) Assignee: Veeco Instruments, Inc., Woodbury, NY (US)

( * ) Notice: Subject to any disclaimer, the term of this patent is extended or adjusted under 35 U.S.C. 154(b) by 184 days.

(21) Appl. No.: 10/211,749

(22) Filed: Aug. 2, 2002

(65) Prior Publication Data

US 2004/0020894 A1 Feb. 5, 2004

(51) Int. Cl.$^7$ ............................................. H01L 21/302
(52) U.S. Cl. ......................... 438/714; 438/10; 438/17; 438/734; 216/13; 216/15; 216/58
(58) Field of Search ............................. 216/13, 15, 58, 216/59; 438/714, 7, 10, 16, 17, 734

(56) References Cited

U.S. PATENT DOCUMENTS 4,609,809 A * 9/1986 Yamaguchi et al. ... 219/121.35
4,874,947 A * 10/1989 Ward et al. .................. 250/309

FOREIGN PATENT DOCUMENTS

JP          61-224319     * 10/1986

OTHER PUBLICATIONS

Baum et al., *Plasma–Assisted Dry Etching of Noble Metal–Based Materials.* US 2001/0024679 A1, Pub. Date Sep. 27, 2001; Filed Jun. 5, 2001.
Gutsche et al., *Patterning of 0.175 µm Platinum Features Using Ar/O$_2$ Chemically Assisted Ion–Beam Etching*, J. Vac. Sci. Technol. B 18(2), Mar./Apr. 2000.
Veeco Instruments Inc., *NEXUS™ Ion Beam Etching Systems.* Brochure, 12 pp., printed Dec. 2000.
Veeco Instruments Inc., *Patterning of Metal Contacts Using Ion Beam Etching*, Brochure, 6 pp., printed Jul. 2002.
Schneider et al., *Etching Characteristics of Noble Metal Electrode*, Mater. Res. Soc. Symp. Proc., vol. 655, Ferroelectric Thin Films IX, 6 pp., 2001.

* cited by examiner

*Primary Examiner*—George A. Goudreau
(74) *Attorney, Agent, or Firm*—Wood, Herron & Evans, LLP (57) ABSTRACT

A multi-step etching process for a lead overlay structure such as a thin-film magnetic head structure using secondary ion mass spectroscopy (SIMS) whereby high selectivity of a lead material or other high conductivity metal layer is realized versus that of a metallic mask material and stopping layer. The first step includes patterning the mask layer using IBE or RIE. Advantageously, a photoresist layer is present over a portion of the mask layer and is left in place to be removed in a subsequent step. The second step includes etching the high conductivity metal layer using CAIBE or RIBE with an inert/reactive gas mixture and using SIMS to detect when the stopping layer is reached. The gas mixture comprises an inert gas and a reactive gas that is either oxygen, nitrogen, or a combination of oxygen and nitrogen, whereby the ionized gas mixture contains ions that increase the sensitivity of the SIMS yield of the stopping layer such that the end point of the high conductivity metal layer is detected and etching can then be stopped at the appropriate time. The chemistry of the second etching step is effective to also remove the photoresist at a high etch rate. The third step includes etching the stopping layer with IBE using an inert gas, advantageously with a high angle of about 40-70°. The third step may also be effective to etch debris redeposited on the sidewalls of the structure, and to remove all or a portion of the remaining mask layer.

51 Claims, 4 Drawing Sheets

HIGH SELECTIVITY ETCHING OF A LEAD OVERLAY STRUCTURE

FIELD OF THE INVENTION

This invention relates to etching of lead structures.

BACKGROUND OF THE INVENTION

Ion beam etching (IBE) and reactive ion beam etching (RIBE) techniques have been used in research and multiple niche applications over the last 15–20 years. In the last five years, "ion milling" techniques have been extensively employed in the manufacture of lead overlay structures, such as thin film magnetic heads (TFMHs) for the data storage industry. The important advantages of ion milling over other etching techniques are excellent etch uniformity and control of etch feature profiles.

Recent trends in the TFMH industry, including shrinkage of the head (slider) form factor and the introduction of high-sensitivity magnetoresistive read elements, have driven the need for anisotropic etching techniques with high selectivity and/or etch control combined with high throughput, reproducibility (repeatability), and yield. Until recently, high-throughput production operations and the deployment of RIBE processes have been hampered by the short filament life and reliability problems of the standard Kaufmnan-type ion sources, particularly when operated with high concentrations of reactive gases. These problems have been eliminated with the introduction of filamentless ion sources, such as the RF inductively coupled plasma (RF-ICP) ion source.

The most competitive alternative technique is reactive ion etching (RIE), which is widely used in the semiconductor industry. In RIE, the substrate is mounted inside the plasma reactor and directional etching is accomplished by applying an electrical bias to the substrate. This allows, in principle, high etch rates and selectivity using reactive plasmas. Optimum results are obtained for RIE processes when the surface to be etched is reacted with a chemical species in the plasma to form volatile reaction products which are pumped out of the system. However, data storage device materials are not highly reactive, and the reactive gas chemistries that have been found for these materials do not easily produce volatile reaction products. Oxide/metal etch selectivities are typically of the order of 10:1, but some of the useful RIE gases also attack photoresist, resulting in poor etch selectivity to resist masks. In addition, etch anisotropy can be poor and the production of unetched residues can result in rough etched surfaces and performance problems. For etching TFMH materials, IBE or RIBE can provide superior etch profiles, and RIBE selectivities and etch rates can be competitive with RIE.

The advantages of "ion milling" or IBE have been described throughout the literature, and include independent control of ion beam energy and current density, and separation of plasma and substrate conditions. That is, the substrate is located outside the plasma which generates the ions, allowing independent optimization of the etching process and the plasma generation process. Energetic, highly directional ions delivered as a broad, high-density beam at the optimum incidence angle(s) to the substrate can produce highly anisotropic etch profiles. Because of the separation of the wafer from the plasma, IBE process pressures are typically two orders of magnitude below those of parallel-plate RIE systems. These low process pressures ensure lossless transport of ion energies to the substrate for maximum anisotropy and limit redeposition of etched material back onto the wafer.

A "pure" IBE process uses inert gases such as argon as the source of etching ions, which may be considered a purely physical etch process. Advantages of this approach are the ability to etch any material, and to etch multi-component materials without residues due to preferential etching. Because no reactive processes are involved, IBE etch repeatability can be well controlled and performance is not sensitive to variables such as wafer preparation. Correspondingly, the lack of a chemical etch component may also limit the etch rates and selectivities obtained by IBE.

Under certain etch conditions, unacceptable levels of sidewall redeposition (also known as "fences") can occur for IBE. This is especially a concern when etching metals, particularly noble metals and alloys such as permalloy. Similar problems are observed with RIE of these materials because of the need to use a large physical etch component, as mentioned above. In fact, this effect is exacerbated at normal incidence (RIE configuration), whereas in the IBE process an off-normal etch angle can be used (for example, during the "overetch" stage) to remove redeposited material from the sidewall. It has been demonstrated that production devices can be fabricated in high yield with negligible sidewall redeposition by this method. IBE is presently the preferred method used for patterning the permalloy pole tip in the TFMH industry.

In the RIBE and CAIBE (chemically assisted IBE) method, reactive gases are supplied to the ion source instead of, or in combination with, inert gas. This provides a chemical etch component to supplement the physical etch process. RIBE may be viewed as combining the features of RIE and IBE. Compared to RIE, RIBE and CAIBE provide greater control of the chemical versus the physical etch features. Like IBE, they also provide the capability to easily adjust the etch angle to tailor the sidewall profile or adjust the etch selectivity.

As mentioned, until recently, this technique has had limited usefulness in a production environment because of the fact that most Kaufman ion sources use a DC discharge to generate the plasma. H. R. Kaufman, "Broad-beam Ion Sources: Present Status and Future Directions," J. Vac. Sci. Technol. A, Vol. 4, No. 3, p. 764 (1986). Broadbeam DC ion sources use hot filaments or hollow cathodes to generate the needed electrons. Hot filaments and hollow cathodes have extremely short lifetimes in corrosive or reducing gas environments. Operation of a DC discharge source at greater than 50% reactive gas is not usually possible even for short periods, because of instability and immediate cathode degradation. Consequently, the reported RIBE etch selectivities have also been limited. These problems are not encountered with an RF-ICP ion beam source such as the one described by V. Kanarov et al., "Thirty Five Centimeter Diameter Radio Frequency Ion-beam Source," Rev. Sci. Instr., Vol. 69, p. 874 (1998). Since there is no filament or cathode in the plasma, the time between maintenance operations is greatly extended compared to a DC discharge ion source, even for inert gas operation.

While many etching techniques have been employed, current methods do not achieve etching of multiple layer lead overlay structures in a manner that is effective and efficient. There is thus a need for a method of effectively and efficiently etching a multi-layer structure that achieves high selectivity for the lead or other high conductivity material, while achieving low sidewall redeposition and accurate critical dimensions.

SUMMARY OF THE INVENTION

The present invention provides a multi-step etching process using secondary ion mass spectroscopy (SIMS)

whereby high selectivity of the lead material or other high conductivity metal layer is realized versus that of a metallic mask material and stopping layer. To this end, in a lead structure that comprises at least a mask layer, stopping layer and a high conductivity metal layer such as a lead material therebetween, the first step includes patterning the mask layer using IBE or RIE. Advantageously, a photoresist layer is present over a portion of the mask layer and is left in place to be removed in a subsequent step. The second step includes etching the high conductivity metal layer, such as a Au or Au/Pt layer, using CAIBE or RIBE with an inert/reactive gas mixture and using SIMS to detect when the stopping layer is reached. The gas mixture comprises an inert gas, such as Ar, and a reactive gas that is either oxygen, nitrogen, or a combination of oxygen and nitrogen, whereby the ionized gas mixture contains ions that increase the sensitivity of the SIMS yield of the stopping layer such that the end point of the high conductivity metal layer is detected and etching can then be stopped at the appropriate time. The chemistry of the second etching step is effective to also remove the photoresist at a high etch rate. The third step includes etching the stopping layer with EBE using an inert gas, advantageously with a high angle of about 40–70°. The third step may also be effective to etch debris redeposited on the sidewalls of the structure, and to remove all or a portion of the remaining mask layer. By this invention, a high selectivity process is achieved to allow etching of extremely fine features using both physically-based etching and chemically-based etching in combination with SIMS for end point detection in which the sensitivity of the SIMS yield for particular materials is increased due to the ionic species used in the etching process.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

The present invention provides a high selectivity, multi-step etching process using both physically-based etching and chemically-based etching in combination with SIMS for end point detection whereby high selectivity of a lead material or other high conductivity metal layer is realized versus that of a metallic mask material and stopping layer. The method employs IBE or RIE for etching the mask and stopping layers and RIBE or CAIBE for etching the high conductivity metal layer. SIMS is used with the RIBE/CAIBE etch and may be used with the IBE etches. The sensitivity of the SIMS yield for particular materials is increased due to the ionic species used in the etching process. As will be described more fully below, use of this high selectivity process allows etching of extremely fine features, i.e., 0.1 μm or below, due to several aspects of the invention: a reduction of the aspect ratio of the feature due to a reduction in mask height during the process, for example due to in situ ashing; a reduction in sidewall redeposition due to the reduction in the aspect ratio; the ability to use appropriate etch angles to remove redeposition and hold accurate critical dimensions; and the ability to use physically-based etching and chemically-based etching sequentially and in multiple steps to improve critical dimension variation and redeposition formation.

Figure 1A:
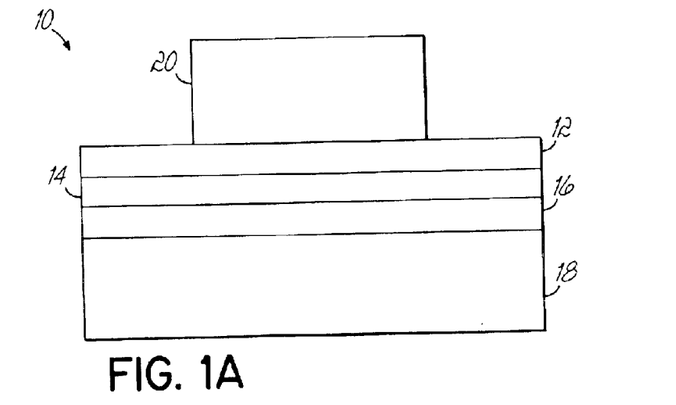
FIGS. 1A–1D are schematic views of a general multi-step method of the present invention for etching a lead structure, such as a TFMH structure.

To this end, and with reference to FIGS. 1A–1D, a multi-step, top down etching method is used for a lead structure 10, such as a TFMH structure, that comprises at least a mask layer 12, a high conductivity metal layer 14 such as a lead material, and a stopping layer 16, as shown in FIG. 1A. Generally, the stopping layer 16, which may be a diffusion barrier layer, is a thin film transition metal-based layer or bilayer deposited on a substrate 18. By way of example only and not limitation, the stopping layer may comprise Ti, Ti-base alloys, Ta, Ta-base alloys, Cr, Cr-base alloys, and combinations thereof as single layers, bilayers other multi-layer arrangements. The high conductivity metal layer 14, such as a Au lead material or Au/Pt bilayer, is deposited on the stopping layer 16. By way of further example, the metal layer 14 advantageously comprises a noble or precious metal or like metal, which group generally includes Cu, Rh, Pd, Ag, Os, Ir, Pt and Au. The metallic mask layer 12 is applied over the high conductivity metal layer 14. Mask layer 12 may comprise the same material as stopping layer 16 or a different like material. A photoresist 20 is generally applied over a portion of the mask layer 12. A photoresist is generally understood in the art to refer to a radiation-sensitive material that, when applied, exposed and developed, masks portions of an underlying substrate with a high degree of integrity.

Figure 1B:
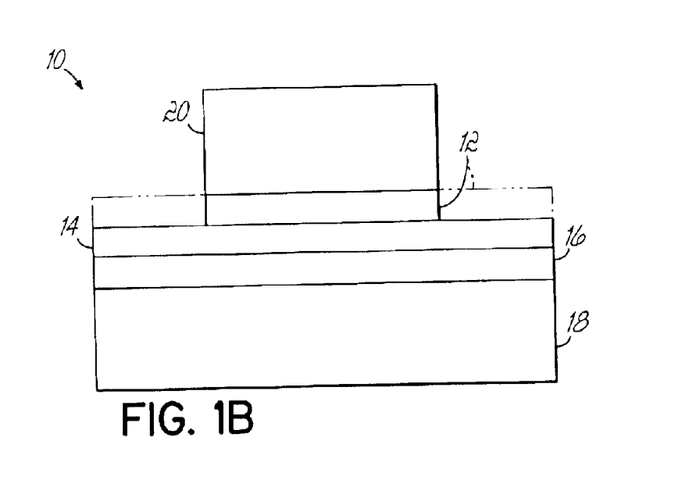

The first step, depicted in FIG. 1B, includes patterning the mask layer 12 using IBE or RIE. Advantageously, the photoresist layer 20 is present over a portion of the mask layer 12 and is left in place to be removed in a subsequent step. As can be seen in FIG. IB, the photoresist 20 aids in defining the portion (indicated in phantom) to be removed by the etching process. This first etching or patterning step includes a physical etching technique, advantageously using an inert gas such as argon, to remove a portion (shown in phantom) of the mask layer 12 for use as a hard mask for subsequent etching of the metal layer 14. In one embodiment, the technique used, in particular RIE, has high selectivity to the metal comprising the metal layer 14, for example Au. Selectivity is defined as the ratio of the etch rate of the material being etched, or desired to be etched, to the etch rate of another material(s) in the structure, such as a mask material or underlayer. Thus, in this first etching step, a selectivity to the metal layer 14 of at least about 2:1 is desired, meaning that the etch rate for the mask layer 12 is at least about twice the etch rate of the metal layer 14. Advantageously, the selectivity to the metal layer 14 is at least about 5:1. In another embodiment, the technique used, in particular IBE, is carried out in combination with the use of SIMS for end point detection. SIMS indicates specifically when the next layer of material, i.e., the metal layer 14, is reached such that the first etch step may be halted.

Figure 1C:
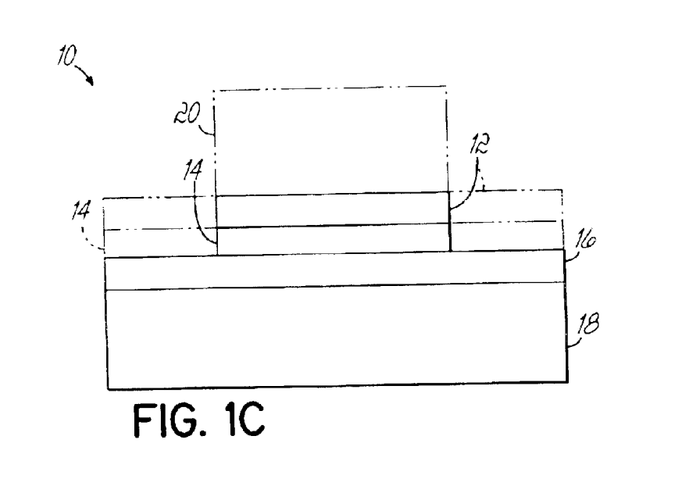

The second step, depicted in FIG. 1C, includes a chemically-based etching of the high conductivity metal layer 14, such as a Au layer or Au/Pt bilayer, using CAIBE or RIBE with an inert/reactive gas mixture and using SIMS to detect when the stopping layer 16 is reached. The gas mixture comprises an inert gas, such as Ar, and a reactive gas that is either oxygen ($O_2$), nitrogen ($N_2$), $O_2+N_2$, or other combination of oxygen and nitrogen, whereby the ionized gas mixture contains ions that increase the sensitivity of the SIMS yield of the stopping layer 16 such that the end point of the high conductivity metal layer 14 is detected and etching can then be stopped at the appropriate time, i.e., when the stopping layer 16 is reached. The use of SIMS for stopping the etch in the appropriate layer is effective even for extremely small exposed areas, such as 1% or less.

Further, the use of the inert/reactive gas mixture in the CAIBE or RIBE process allows for etching of the high conductivity metal layer 14 with high selectivity, at least about 2:1 and advantageously at least about 5:1, to the mask layer 12 and stopping layer 16. Advantageously, the gas mixture consists essentially of oxygen and/or nitrogen and an inert gas. The $O_2$ and/or $N_2$ reactive component allows for the etch rate of the high conductivity metal layer 14 to remain equal while decreasing the etch rates of the mask layer 12 and stopping layer 16 thereby increasing the selectivity of the etching step.

The chemistry of the second etching step is also effective to remove the photoresist 20 at a high etch rate, also referred to as in situ ashing, thereby allowing for deep sub-micron patterning. Removing the photoresist 20 effectively lowers the mask height during the process since the photoresist 20 and etched mask layer 12 act concurrently as a mask for the metal layer 14 in the second etching step, as can be seen from the progression of FIGS. 1B to 1C. A reduction in debris redeposition on sidewalls of the structure 10 also results from removal of the photoresist 20 in the second etching step.

Figure 1D:
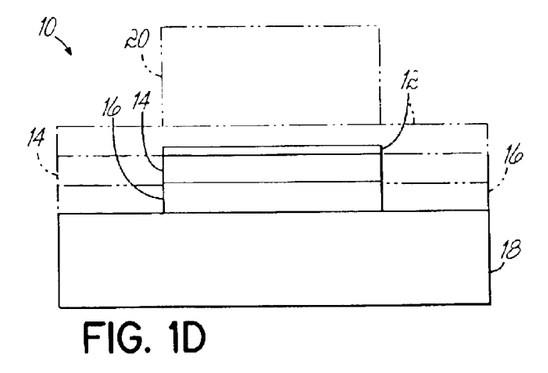

The third step, the result of which is depicted in FIG. 1D, includes etching the stopping layer 16 with IBE using an inert gas, such as Ar, advantageously with a high angle of about 40–70°. The third step is also effective for etching or removing debris (not shown) redeposited on the sidewalls of the structure, and to remove all or a portion of the remaining mask layer 12. In FIG. 1D, a substantial portion (shown in phantom) of mask layer 12 is removed. The third etching step may also be referred to as a cleaning and redeposition removal step. Due to the removal of the photoresist 20 in the second etching step, the physically-based etch can be used with appropriate etch angles to remove redeposition and hold accurate critical dimensions.

Use of a physically-based etch and a chemically-based etch sequentially and in multiple steps improves the critical dimension variation and redeposition formation, for example, by enabling in situ ashing of the photoresist. Use of SIMS, particularly in the chemically-based etch, allows the etch to be stopped in the appropriate layer even for extremely small exposed areas. Use of all oxygen and nitrogen containing gases and inert gases and mixtures thereof for RIBE and CAIBE of noble metals allows for realization of high selectivity of the noble metal to the metallic mask and stopping layers, and an increase in sensitivity of the end point detection due to the particular ionic species used. These and other advantages may be achieved by the present invention, which will now be further described with reference to two specific examples.

EXAMPLE 1

Figure 2A:
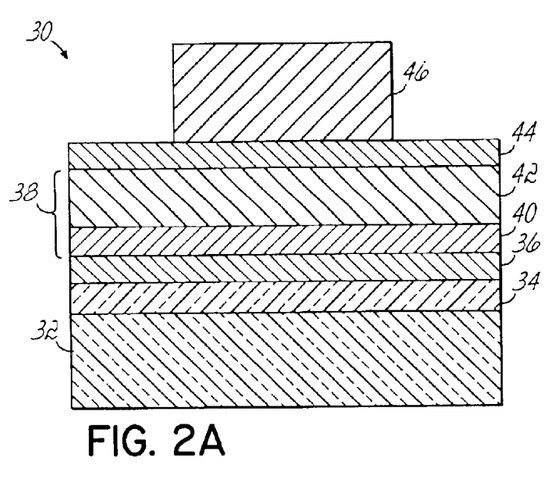
FIGS. 2A–2D are schematic views of an exemplary multi-step method of the present invention for etching a photoresist/TiW/Au/Pt/TiW/SiO$_2$/Si lead structure.

With reference to FIGS. 2A–2D, a multi-step, top down etching method is used for a lead structure 30 as specifically depicted in FIG. 2A. Structure 30 comprises an Si substrate 32 having an $SiO_2$ dielectric layer 34 thereon. A TiW barrier layer 36, which may also be referred to as stopping layer 36, is applied over the dielectric layer 34. A Au/Pt bilayer 38 is applied on the TiW barrier layer 36, wherein Pt layer 40 is adjacent the TiW barrier layer 36 and Au layer 42 is over the Pt layer 40. A TiW mask layer 44 is applied over Au layer 42 for use as a hard mask for the Au material. A photoresist 46 is applied over a portion of the TiW mask layer 44.

Figure 2B:
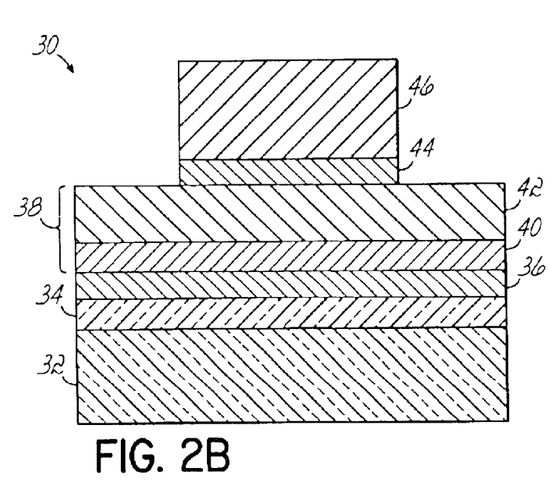

In the first step, the result of which is depicted in FIG. 2B, the TiW mask layer 44 is patterned using Ar IBE and SIMS to stop the etching when Au layer 42 is exposed. As seen in FIG. 2B, the portion of TiW mask layer 44 that is removed by the first etch step is that portion which is not covered by photoresist 46. RIE may be used instead of IBE with a selectivity of TiW to Au of at least about 2:1, and advantageously about 5:1.

Figure 2C:
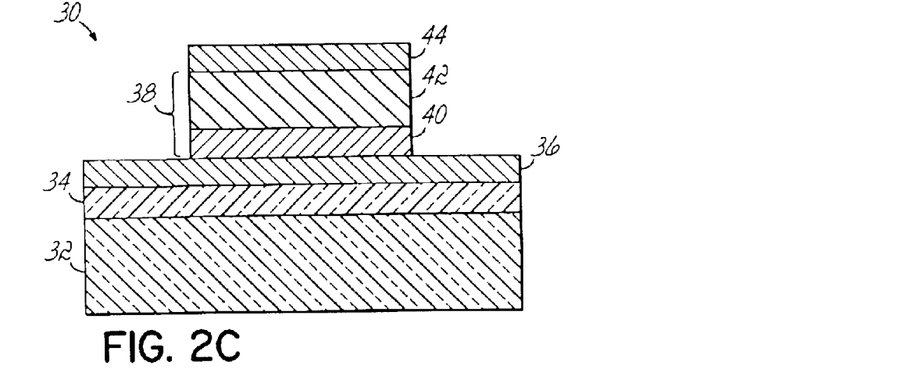

In the second step, the result of which is depicted in FIG. 2C, the Au/Pt bilayer 28 is etched using CAIBE or RIBE with an $Ar/O_2$ gas mixture and SIMS for stopping the etch when the TiW barrier layer 36 is reached. The oxygen ions from the gas mixture increase the SIMS yields for the TiW barrier layer 36 and therefore the $O_2$ based process may be used for low etch rates and small exposed areas. The $Ar/O_2$ gas mixture further gives high selectivity of at least about 2:1 to the TiW barrier layer 36 and TiW mask layer 44 and further provides a high rate etch of photoresist 46. An $N_2$/Ar or $O_2/N_2$/Ar gas mixture or other O and/or N-containing gas with an inert gas may be used in place of the $O_2$/Ar gas mixture.

Figure 2D:
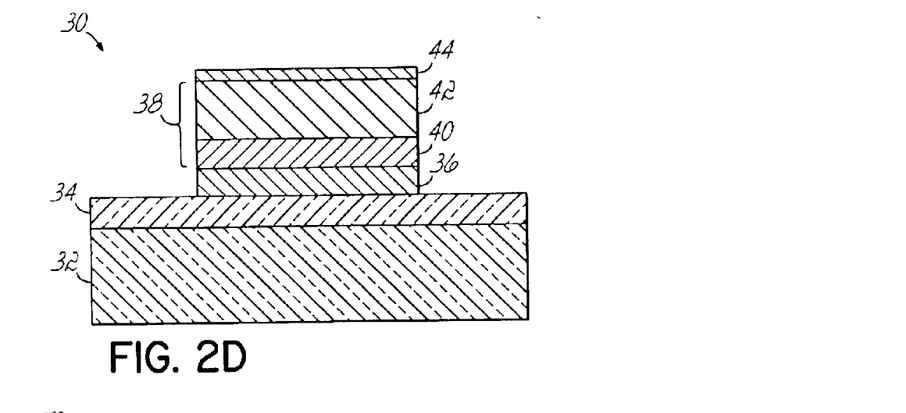

In a third step, the result of which is depicted in FIG. 2D, a final clean and redeposition removal is carried out with Ar IBE at a high angle of about 40–70°. This third etching step cleans the surface, removes side wall redeposition, and removes a substantial portion of the remaining TiW mask layer 44.

EXAMPLE 2

Figure 3A:
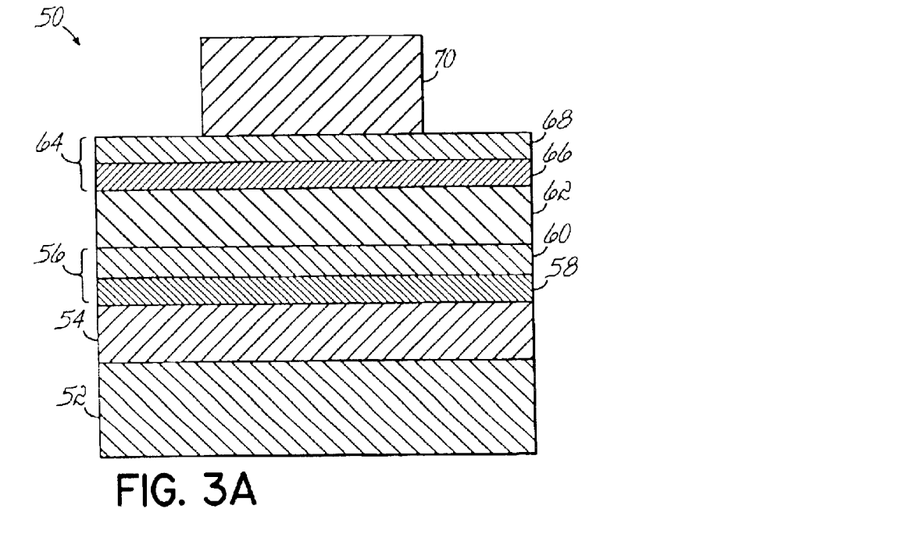
FIGS. 3A–3D are schematic views of an exemplary multi-step method of the present invention for etching a photoresist/Ti/Ta/Au/Ti/Ta/GMR sensor stack/alumina lead structure, specifically a TFMH structure.

With reference to FIGS. 3A–3D, a multi-step, top down etching method is used for a TFMH structure 50. Structure 50, as shown in FIG. 3A, comprises an alumina gap 52 upon which a GMR (giant magnetoresistance) stack 54 is formed. A Ti/Ta bilayer 56, which functions as a stopping layer, is formed on the GMR stack 54 with Ta layer 58 adjacent the GMR stack 54 and a Ti layer 60 over the Ta layer 58. A Au lead 62 is deposited on the Ti/Ta bilayer 56. Another Ti/Ta bilayer 64 is formed over the Au lead 62 for use as a hard mask for the Au lead etch. Specifically, a Ta layer 66 is adjacent the Au lead 62 and a Ti layer 68 is over the Ta layer 66. A photoresist 70 is formed on a portion of the Ti/Ta bilayer 64.

Figure 3B:
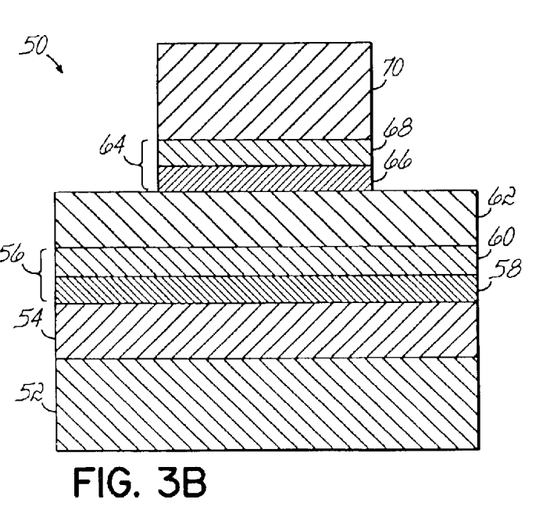

In the first etching step, the result of which is depicted in FIG. 3B, the Ti/Ta bilayer 64 is etched using Ar IBE and SIMS for stopping the etch when the Au lead 62 is exposed. RIE with high selectivity to Au may be used instead of IBE.

Figure 3C:
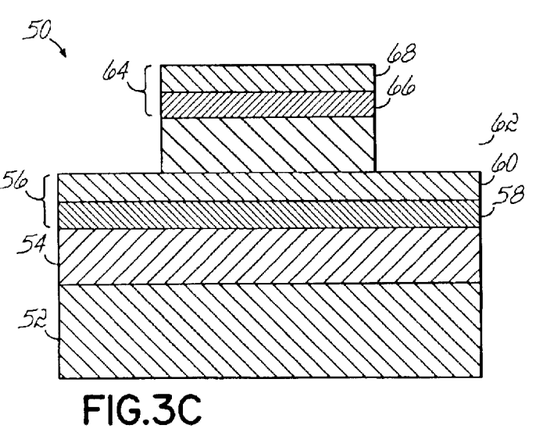

In the second step, the result of which is depicted in FIG. 3C, the Au lead 62 is etched using RIBE or CAIBE with an $Ar/O_2$ gas mixture and SIMS for stopping the etch when the Ti layer 60 is exposed. The $O_2$ based process allows for increased SIMS yields for the Ti layer 60 and thus may be used for low etch rates and small exposed areas. The $Ar/O_2$ gas mixture also has a high selectivity of at least about 2:1 to the Ti layers 60, 68 and removes the photoresist 70 at the same time allowing for deep sub-micron patterning of structure 50. An $O_2/N_2$/Ar gas mixture or other O- and/or N-containing gas with inert gas may be used in place of the $Ar/O_2$ gas mixture.

Figure 3D:
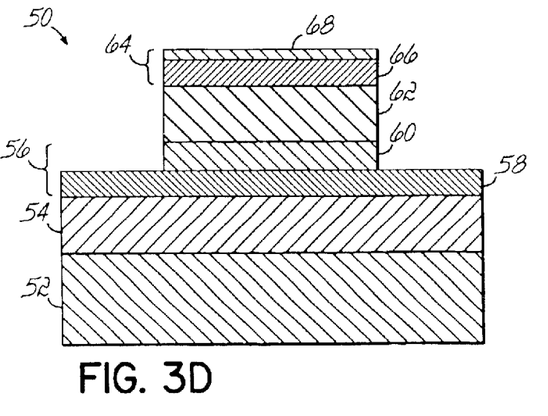

The third etching step, the result of which is depicted in FIG. 3D, is a final clean and redeposition removal using Ar IBE at a high angle of about 40–70°. This third etching step cleans the surface, removes redeposition from side walls of the structure 50, etches at least Ti layer 60 of the Ti/Ta bilayer 56, and removes a portion of the Ti/Ta bilayer 64 including a substantial portion of Ti layer 68.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of Applicant's general inventive concept.

What is claimed is:

1. A method of etching a lead structure comprising at least a mask layer, a high conductivity metal layer and a stopping layer, the method comprising at least the steps of:
   (a) patterning the mask layer through to the high conductivity metal layer with a process selected from the group consisting of ion beam etching and reactive ion etching;
   (b) etching the high conductivity metal layer through to the stopping layer with a process selected from the group consisting of chemically assisted ion beam etching or reactive ion beam etching, wherein the etching process uses a gas mixture of an inert gas and a reactive gas selected from the group consisting of oxygen, nitrogen, and a combination of oxygen and nitrogen, and further comprising using secondary ion mass spectroscopy for end point detection and stopping the etching when the end point detection indicates the stopping layer is reached; and
   (c) etching the stopping layer with ion beam etching using an inert gas.

2. The method of claim 1 wherein the patterning process of step (a) has a selectivity to the high conductivity metal layer of at least 2:1.

3. The method of claim 1 wherein the patterning process of step (a) has a selectivity to the high conductivity metal layer of at least about 5:1.

4. The method of claim 1 wherein the etching process of step (b) has a selectivity to the mask layer and the stopping layer of at least 2:1.

5. The method of claim 1 wherein the etching process of step (b) has a selectivity to the mask layer and the stopping layer of at least about 5:1.

6. The method of claim 1 wherein the structure further comprises a photoresist, and wherein the method further comprises leaving the photoresist in place during step (a) and removing the photoresist during step (b).

7. The method of claim 1 wherein the high conductivity metal layer comprises a Au lead material.

8. The method of claim 1 wherein the high conductivity metal layer comprises a Au/Pt bilayer.

9. The method of claim 1 wherein the mask layer and stopping layer each comprise TiW.

10. The method of claim 1 wherein the mask layer and stopping layer each comprise a Ti/Ta bilayer.

11. The method of claim 1 wherein the patterning of step (a) is with ion beam etching using Ar gas and further comprising using secondary ion mass spectroscopy for end point detection and stopping the patterning when the end point detection indicates the high conductivity metal layer is reached.

12. The method of claim 1 further comprising, during step (c), etching the mask layer until at least a portion of said layer is removed.

13. The method of claim 1 further comprising, during step (c), etching debris redeposited on sidewall structures during steps (a) and (b).

14. The method of claim 1 wherein steps (a)–(c) are performed sequentially in a single vacuum chamber without removing the structure between steps.

15. The method of claim 1 wherein the inert gases of steps (b) and (c) are both Ar.

16. The method of claim 1 wherein the high conductivity metal layer is a noble metal.

17. A method of etching a lead structure comprising at least a photoresist, a mask layer, a high conductivity metal layer and a stopping layer, the method comprising:
   (a) patterning the mask layer through to the high conductivity metal layer, leaving the photoresist in place, with a process selected from the group consisting of:
      (i) ion beam etching using secondary ion mass spectroscopy for end point detection and stopping the patterning when the end point detection indicates the high conductivity metal layer is reached, and
      (ii) reactive ion etching having a selectivity to the high conductivity metal layer of at least 2:1;
   (b) etching the high conductivity metal layer through to the stopping layer and removing the photoresist with a process selected from the group consisting of chemically assisted ion beam etching and reactive ion beam etching, the process having a selectivity to the mask layer and the stopping layer of at least 2:1, wherein the etching process uses a gas mixture of an inert gas and a reactive gas selected from the group consisting of oxygen, nitrogen, and a combination of oxygen and nitrogen and wherein the process further comprises using secondary ion mass spectroscopy for end point detection and stopping the etching when the end point detection indicates the stopping layer is reached; and
   (c) etching the stopping layer with ion beam etching at an angle of about 40–70° using an inert gas.

18. The method of claim 17 wherein the patterning process of step (a)(ii) has a selectivity to the high conductivity metal layer of at least about 5:1.

19. The method of claim 17 wherein the etching process of step (a)(i) has a selectivity to the high conductivity metal layer of at least 2:1.

20. The method of claim 17 wherein the etching process of step (a)(i) has a selectivity to the high conductivity metal layer of at least 5:1.

21. The method of claim 17 wherein the etching process of step (b) has a selectivity to the mask layer and the stopping layer of at least about 5:1.

22. The method of claim 17 wherein the high conductivity metal layer comprises a Au lead material.

23. The method of claim 17 wherein the high conductivity metal layer comprises a Au/Pt bilayer.

24. The method of claim 17 wherein the mask layer and stopping layer each comprise TiW.

25. The method of claim 17 wherein the mask layer and stopping layer each comprise a Ti/Ta bilayer.

26. The method of claim 17 wherein the patterning of step (a) is with ion beam etching using Ar gas.

27. The method of claim 17 further comprising, during step (c), etching the mask layer until at least a portion of said layer is removed.

28. The method of claim 17 further comprising, during step (c), etching debris redeposited on sidewall structures during steps (a) and (b).

29. The method of claim 17 wherein steps (a)–(c) are performed sequentially in a single vacuum chamber without removing the structure between steps.

30. The method of claim 17 wherein the inert gases of steps (b) and (c) are both Ar.

31. The method of claim 17 wherein the high conductivity metal layer is a noble metal.

32. A method of etching a lead structure comprising at least a photoresist, a TiW mask layer, a Au/Pt bilayer and a TiW stopping layer, the method comprising:
- (a) patterning the TiW mask layer through to the Au/Pt bilayer, leaving the photoresist in place, with a process selected from the group consisting of:
  - (i) ion beam etching using secondary ion mass spectroscopy for end point detection and stopping the patterning when the end point detection indicates the Au/Pt bilayer is reached, and
  - (ii) reactive ion etching having a selectivity to Au of at least 2:1;
- (b) etching the Au/Pt bilayer through to the TiW stopping layer and removing the photoresist with a process selected from the group consisting of chemically assisted ion beam etching and reactive ion beam etching, the process having a selectivity to TiW of at least 2:1, wherein the etching process uses a gas mixture of an inert gas and a reactive gas selected from the group consisting of oxygen, nitrogen, and a combination of oxygen and nitrogen and wherein the process further comprises using secondary ion mass spectroscopy for end point detection and stopping the etching when the end point detection indicates the TiW stopping layer is reached; and
- (c) etching the TiW stopping layer with ion beam etching at an angle of about 40–70° using an inert gas.

33. The method of claim 32 wherein the patterning process of step (a)(ii) has a selectivity to Au of at least about 5:1.

34. The method of claim 32 wherein the etching process of step (a)(i) has a selectivity to Au of at least 2:1.

35. The method of claim 32 wherein the etching process of step (a)(i) has a selectivity to Au of at least 5:1.

36. The method of claim 32 wherein the etching process of step (b) has a selectivity to TiW of at least about 5:1.

37. The method of claim 32 wherein the patterning of step (a) is with ion beam etching using Ar gas.

38. The method of claim 32 further comprising, during step (c), etching the TiW mask layer until at least a portion of said layer is removed.

39. The method of claim 32 further comprising, during step (c), etching debris redeposited on sidewall structures during steps (a) and (b).

40. The method of claim 32 wherein steps (a)–(c) are performed sequentially in a single vacuum chamber without removing the structure between steps.

41. The method of claim 32 wherein the inert gases of steps (b) and (c) are both Ar.

42. A method of etching a lead structure comprising at least a photoresist, a Ti/Ta mask bilayer, a Au lead layer and a Ti/Ta stopping bilayer, the method comprising:
- (a) patterning the Ti/Ta mask bilayer through to the Au lead layer, leaving the photoresist in place, with a process selected from the group consisting of:
  - (i) ion beam etching using secondary ion mass spectroscopy for end point detection and stopping the patterning when the end point detection indicates the Au lead layer is reached, and
  - (ii) reactive ion etching having a selectivity to Au of at least 2:1;
- (b) etching the Au lead layer through to the Ti/Ta stopping bilayer and removing the photoresist with a process selected from the group consisting of chemically assisted ion beam etching and reactive ion beam etching, the process having a selectivity to Ti of at least 2:1, wherein the etching process uses a gas mixture of an inert gas and a reactive gas selected from the group consisting of oxygen, nitrogen, and a combination of oxygen and nitrogen and wherein the process further comprises using secondary ion mass spectroscopy for end point detection and stopping the etching when the end point detection indicates the Ti/Ta stopping bilayer is reached; and
- (c) etching the Ti/Ta stopping bilayer with ion beam etching at an angle of about 40–70° using an inert gas.

43. The method of claim 42 wherein the patterning process of step (a)(ii) has a selectivity to Au of at least about 5:1.

44. The method of claim 42 wherein the etching process of step (a)(i) has a selectivity to Au of at least 2:1.

45. The method of claim 42 wherein the etching process of step (a)(i) has a selectivity to Au of at least 5:1.

46. The method of claim 42 wherein the etching process of step (b) has a selectivity to Ti of at least about 5:1.

47. The method of claim 42 wherein the patterning of step (a) is with ion beam etching using Ar gas.

48. The method of claim 42 further comprising, during step (c), etching the Ti/Ta mask bilayer until at least a portion of said bilayer is removed.

49. The method of claim 42 further comprising, during step (c), etching debris redeposited on sidewall structures during steps (a) and (b).

50. The method of claim 42 wherein steps (a)–(c) are performed sequentially in a single vacuum chamber without removing the structure between steps.

51. The method of claim 42 wherein the inert gases of steps (b) and (c) are both Ar.

* * * * *

UNITED STATES PATENT AND TRADEMARK OFFICE
CERTIFICATE OF CORRECTION

PATENT NO. : 6,838,389 B2
DATED : January 4, 2005
INVENTOR(S) : Kurt E. Williams and Hariharakeshara Hegde

It is certified that error appears in the above-identified patent and that said Letters Patent is hereby corrected as shown below:

Column 1,
Lines 26-27 read "...life and reliability problems of the standard Kaufmnan-type ion sources, particularly when operated with high..." and should read -- ...life and reliability problems of the standard Kaufman-type ion sources, particularly when operated with high... --.

Column 3,
Line 22, reads "...stopping layer with EBE using an inert gas, advantageously..." and should read -- ...stopping layer with IBE using an inert gas, advantageously... --.

Signed and Sealed this

Sixteenth Day of August, 2005

JON W. DUDAS
*Director of the United States Patent and Trademark Office*